(12) United States Patent
Denneler et al.

(10) Patent No.: US 8,258,677 B2
(45) Date of Patent: Sep. 4, 2012

(54) PIEZOELECTRIC COMPONENT WITH DIRECTLY STRUCTURED EXTERNAL CONTACTING, METHOD FOR MANUFACTURING THE COMPONENT AND USE OF SAID COMPONENT

(75) Inventors: Stefan Denneler, Munich (DE); Axel Ganster, Schwindegg (DE); Susanne Kornely, Munich (DE); Andreas Lenk, Bannewitz Ot Possendorf (DE); Carsten Schuh, Baldham (DE); Andreas Wolff, Munich (DE); Jorg Zapf, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/512,556

(22) Filed: Jul. 30, 2009

(65) Prior Publication Data

US 2010/0066212 A1    Mar. 18, 2010

Related U.S. Application Data

(60) Provisional application No. 61/085,112, filed on Jul. 31, 2008.

(51) Int. Cl.
*H01L 41/047* (2006.01)
(52) U.S. Cl. ........................................ 310/328; 310/365
(58) Field of Classification Search .................. 310/328, 310/365, 366
See application file for complete search history.

(56) References Cited

U.S. PATENT DOCUMENTS

| | | | |
|---|---|---|---|
| 5,459,371 A * | 10/1995 | Okawa et al. | 310/363 |
| 6,798,059 B1 | 9/2004 | Ishihara et al. | |
| 7,268,471 B2 * | 9/2007 | Riemer | 310/365 |
| 2005/0269914 A1 * | 12/2005 | Berlemont | 310/366 |
| 2006/0232173 A1 * | 10/2006 | Kobane et al. | 310/366 |
| 2007/0216265 A1 | 9/2007 | Cooke et al. | |
| 2009/0179527 A1 * | 7/2009 | Kaspar et al. | 310/366 |

FOREIGN PATENT DOCUMENTS

| | | |
|---|---|---|
| DE | 4132723 | 4/1992 |
| DE | 102004057795 | 12/2006 |
| EP | 1132978 | 9/2001 |
| EP | 1835553 | 9/2007 |
| JP | 62211974 | 9/1987 |

\* cited by examiner

*Primary Examiner* — Derek Rosenau

(74) *Attorney, Agent, or Firm* — Staas & Halsey LLP

(57) ABSTRACT

The embodiments relate to a piezoelectric component including at least one fully active piezoelectric element comprising electrode layers and piezoelectric layers arranged therebetween. The electrode layers are conveyed to a lateral edge of the piezoelectric element and contacted there. The external electrode is attached in a structured fashion for electrical contacting and/or a structured external electrode is made available: The external electrode essentially includes two components, namely the contacting field and the contacting path. In the event of several piezoelectric elements (piezoelectric actuator in multilayer structure) stacked one above the other, the contacting path functions as a collector electrode, which connects the contacting fields of the piezoelectric elements to one another. The insulation path exists for the electrical insulation of the contacting path from electrode layers which are not to be contacted. A reliable contacting of the electrode layers is possible with the structure according to the invention. A fully active, piezoceramic multilayer actuator with the described contacting is used in automotive engineering for activating fuel injection valves.

16 Claims, 3 Drawing Sheets

PIEZOELECTRIC COMPONENT WITH DIRECTLY STRUCTURED EXTERNAL CONTACTING, METHOD FOR MANUFACTURING THE COMPONENT AND USE OF SAID COMPONENT

CROSS REFERENCE TO RELATED APPLICATIONS

This application is based on and hereby claims priority to U.S. Patent Provisional Application No. 61/085,112 filed on Jul. 31, 2008, the contents of which are hereby incorporated by reference.

BACKGROUND

1. Field

The embodiments discussed herein relate to a piezoelectric component with directly structured external contacting, a method for manufacturing the component and use of said component.

2. Description of the Related Art

Piezoelectric components are used, for instance, within automotive engineering for activating fuel injection valves. The core of these components is a piezoelectric element, in which an electrode layer and an additional electrode layer are arranged one above the other. A piezoelectric layer is disposed between the electrode layers. The piezoelectric layer consists, for instance, of a piezoceramic, such as lead zirconate titanate (PZT). Activation of the electrode layers with different electrical potentials causes an electrical field to couple into the piezoelectric layer. The coupled electrical field results in a deflection (expansion and/or contraction) of the piezoelectric layer and, thus, of the piezoelectric element.

To achieve as significant a deflection as possible at the same time as as high a force transmission as possible, the piezoelectric components are configured in a multilayer structure. In this way a plurality of piezoelectric elements is arranged one above the other to form a piezoelectric element stack. In the piezoelectric element stack, electrode layers (inner electrodes) and piezoelectric layers are arranged alternately one above the other.

A so-called multilayer capacitor structure (comb structure) is usually realized for contacting the electrode layers. In this way, the electrode layers are guided alternately to different side faces of the piezoelectric element and thus to different side faces of the piezoelectric element stack and are electrically contacted there. In the event in particular of monolithic piezoelectric element stacks, it is problematical here that the electrode layers do not delimit the entire surface of the piezoelectric layer arranged therebetween. The arrangement which is not over the entire surface results in piezoelectrically active and piezoelectrically inactive regions. Different electrical fields are coupled into these regions. The different electrical fields result in different deflections and thus in mechanical stresses. These mechanical stresses generally result in cracks. The cracks themselves can be tolerated. They nevertheless result in a significant outlay in terms of an external electrode attached to the side face of the piezoelectric element stack for electrical contacting of the electrode layers.

The so-called fully active piezoelectric actuator represents an alternative variant. With this piezoelectric actuator, the electrode layers and the additional electrode layers delimit the entire surface of the piezoelectric layers arranged therebetween. As a result, an essentially identical electrical field is coupled into the overall piezoelectric layer. This results in hardly any mechanical stresses and cracks resulting therefrom developing. However, it is necessary for the electrode layers to be individually electrically activatable. Care must be taken to ensure that corresponding electrical potentials can be applied to the electrode layers independently of one another.

SUMMARY

An aspect of the embodiments is thus to indicate how the electrode layers of a piezoelectric element of a piezoelectric component can be electrically contacted independently of one another and individually.

To achieve the aspect, a piezoelectric component including at least one stacked piezoelectric element is specified, which, in the stack direction, has at least one electrode layer with electrode material, at least one additional electrode layer with additional electrode material and at least one piezoelectric layer with piezoelectric material arranged between the electrode layers, with the electrode layer extending to at least one lateral or side surface segment of the piezoelectric element, at least one contacting field (contacting pad) with contacting field material being attached to the surface segment for electrical contacting of the electrode layer, at least one electrical insulation path with electrical insulation material being attached to the contacting field and/or to the electrode layer on the surface segment and at least one electrical contacting path with contacting path material being arranged on the insulation path such that the contacting path and the electrode layer are indirectly electrically connected to one another by way of the contacting field and the contacting path and the additional electrode layer are electrically insulated from one another.

The additional electrode layer is preferably also guided to a side face of the piezoelectric element. The additional electrode layer extends to at least one additional lateral surface segment of the piezoelectric element, with at least one additional contacting field with contacting field material being attached to the additional surface segment for electrical contacting of the additional electrode layer, at least one additional electrical insulation path with an additional electrical insulation material being attached to the additional contacting field and/or to the additional electrode layer on the additional surface segment and at least one additional contacting path with additional contacting path material being arranged on the additional insulation path such that the additional contacting path and the additional electrode layer are indirectly connected to one another in an electrically conductive manner by way of the additional contacting field and the additional contacting path and the electrode layer are electrically insulated from one another.

A method for manufacturing the piezoelectric component includes the following method steps is also provided in order to achieve the aspect:

a) providing at least one stacked piezoelectric element with an electrode layer, at least one additional electrode layer and at least one piezoelectric layer arranged between the electrode layers, with the electrode layer extending to a lateral surface segment of the piezoelectric element, b) attaching at least one insulation path to the surface segment, so that the electrode layer is at least partially freely accessible, and c) attaching at least one contacting field to the freely accessible electrode layer and attaching a contacting path to the insulation path so that the contacting path and the electrode layer are indirectly electrically contacted by way of the contacting field and the contacting path and the additional electrode are electrically insulated from one another.

The basic idea behind the embodiments involves attaching the external electrode in a structured fashion and/or providing a structured external electrode. The external electrode essentially includes two components, namely the contacting field and the contacting path. The contacting field and contacting path can be attached one after the other or at the same time. The contacting field may extend to the insulation path. Similarly, the contacting field may be guided to the lateral surface segment. It is, likewise, conceivable for the contacting field and the contacting path to form one individual unit.

In the case of several piezoelectric elements stacked one above the other (see below), the contacting path functions as a collector electrode, which connects the contacting fields of the piezoelectric elements to one another. The insulation path exists for the electrical insulation of the contacting path from electrode layers which are not to be contacted. This structure enables reliable contacting of the electrode layers.

A piezoelectric element is preferably provided which has at least one additional electrode layer, which extends to at least one additional surface segment of the piezoelectric element. The following additional method steps are provided here:

b') attaching at least one additional insulation path to the additional surface segment, so that the additional electrode layer is at least partially freely accessible, and c') attaching at least one additional contacting field to the freely accessible additional electrode layer and attaching an additional contacting path to the additional insulation path, so that the additional contacting path and the additional electrode layer are indirectly electrically connected to one another by way of the additional contacting field and the additional contacting path and the electrode layer are electrically insulated from one another. It is also possible here for the additional contacting field and the additional contacting path to be attached at the same time or one after the other. Similarly, the additional contacting field can be guided to the additional lateral surface segment. It is, likewise, conceivable for the additional contacting field and the additional contacting path to form an individual additional unit.

The piezoelectric component can include an individual, above-described piezoelectric element. The piezoelectric component preferably has a plurality of piezoelectric elements stacked one above the other. The piezoelectric component has a multilayer structure including electrode layers arranged one above the other and piezoelectric layers. According to one particular embodiment, a piezoelectric component is thus specified, with a plurality of piezoelectric elements being arranged one above the other in respect of a piezoelectric element stack such that the surface segments of the piezoelectric elements form a shared stack surface segment, the insulation paths of the piezoelectric elements form a shared stack insulation path, the contacting paths of the piezoelectric elements form a shared stack contacting path (collective contacting path), which is attached to the shared stack insulation path such that the shared stack contacting path and the electrode layers of the piezoelectric elements are indirectly electrically contacted by way of the contacting fields of the piezoelectric elements and the shared stack contacting path and the additional electrode layers of the piezoelectric elements are electrically insulated from one another.

The plurality of piezoelectric elements is preferably arranged in respect of the piezoelectric element stack such that the additional surface segments of the piezoelectric elements form a shared additional stack surface segment, the additional insulation paths of the piezoelectric elements form an additional shared stack insulation path, the additional contacting paths of the piezoelectric elements form an additional shared stack contacting path which is attached to the shared additional stack insulation path such that the additional shared stack contacting path and the additional electrode layers of the piezoelectric elements are indirectly electrically contacted by way of the additional contacting fields of the piezoelectric elements and the shared additional stack contacting path and the electrode layers of the piezoelectric elements are electrically insulated from one another.

The proposed individual contacting of the electrode layers and the additional electrode layers can realize a multilayer capacitor structure. The electrode layers and additional electrode layers do not delimit the entire surface of the piezoelectric layer. However, the electrode layer and the additional electrode layer preferably delimit the entire surface of the piezoelectric layer. The piezoelectric component is completely active.

In one particular embodiment, the surface segment with the contacting field and the additional surface segment with the additional contacting field are arranged on the same side of the piezoelectric element. Consequently, the stack surface segment and the additional stack surface segment in the case of a component in the multilayer structure are likewise arranged on the same side of the piezoelectric element stack. It is, nevertheless, also conceivable for the surface segment with the contacting field and the additional surface segment with the additional contacting field to be arranged on different sides of the piezoelectric element. The stack surface segment and the additional stack surface segment are arranged on different sides of the piezoelectric element stack.

The contacting fields are configured such that an individual contacting of the electrode layers results in each instance. The electrode layers are contacted individually. According to one particular embodiment, the contacting field has a contacting strip with a longitudinal extension, which is aligned in parallel with the electrode layer and/or the additional contacting field has an additional contacting strip with an additional longitudinal alignment, which is aligned in parallel with the additional electrode layer. The contacting fields are arranged along the surface segments, to which the electrode layers are guided.

The piezoelectric component performs an expansion and/or contraction as a result of the electrical activation of the electrode layers. In respect of the expansion and contraction of the piezoelectric element, it is particularly advantageous for the contacting fields to be embodied as contacting strips, the longitudinal extensions of which are oriented in parallel with the electrode layers. No mechanical stress develops in the contacting strips as a result of this orientation, so that a failure due to the mechanical stress and the crack formation resulting therefrom need not be a consideration here.

According to one particular embodiment of the insulation path, the insulation path, the additional insulation path, the contacting field, the additional contacting field, the contacting path and/or the additional contacting path are embodied so as to be extendable as a result of the expansion and contraction. This means that the paths can follow the expansion and contraction of the piezoelectric element and thus of the piezoelectric element stack.

An extendable configuration of the paths relates, for instance, to the path material used. An elastomer, for instance a silicon elastomer, is particularly suited as insulation material.

It is, however, also conceivable for the paths to be structured correspondingly. In one particular embodiment, the paths have path curvatures. The path curvatures provide for the extendability of the paths.

According to one particular embodiment, the insulation path, the additional insulation path, the contacting field, the additional contacting field, the contacting path and/or the additional contacting path have at least one longitudinal structuring and/or a transverse structuring in respect of the stack direction. The paths are structured along or at right angles to the stack direction of the piezoelectric element and/or to the stack direction of the piezoelectric element stack. The structurings are embodied such that mechanical tensile stresses developing in the piezoelectric element and/or piezoelectric element stack as a result of the expansion and contraction are converted into shear stresses. A transverse structuring also results in an efficient mechanical decoupling of the paths from the expansion and contraction of the piezoelectric element and/or the piezoelectric element stack. A tensile load on the path is reduced.

Further measures for increasing the extendability (flexibility) of the paths may be available. In particular, a component is conceivable, whereby the insulation path, the additional insulation path, the contacting path and/or the additional contacting path have a path thickness (path strength) which varies in the stack direction. The variation can take place periodically for instance. According to one particular embodiment, the insulation path, the additional insulation path, the contacting path and/or the additional contacting path have an essentially linear course in the stack direction. For instance, the piezoelectric elements are arranged so as to form a piezoelectric element stack. The paths can be aligned on lateral surface segments of the stack in the stack direction. It is also conceivable, for instance, for the paths to be arranged diagonally on a side face of the piezoelectric element stack.

The piezoelectric material can be any type of material. The piezoelectric material preferably is a piezoceramic. Here the piezoelectric element is preferably monolithic (in one piece). This means that the electrode layer, the additional electrode layer and the piezoceramic layer are manufactured in a joint sintering process (co-firing). The resulting piezoelectric element stack is, likewise, preferably monolithic. To achieve a monolithic piezoelectric element stack of this type, piezoceramic green films, which are pressworked with electrode material, are stacked and sintered one above the other, for instance. The piezoelectric layers and electrode the layers develop during the sintering process.

Different metals are conceivable as electrode material. The electrode material, the additional electrode material, the contacting field material, the additional contacting field material, the contacting path material and/or the additional contacting path material preferably include at least one metal selected from the group of gold, copper, nickel, palladium, platinum and silver. Additional metals are, likewise, conceivable. The materials can only consist of pure metals. Metal alloys, for instance palladium and silver alloys are, however, also conceivable.

Any electrically insulating materials are conceivable as insulation materials. In one particular embodiment, the insulation material and/or the additional insulation material have at least one insulation material selected from the group of plastic (polymer), glass and/or ceramics. The insulation path and/or the additional insulation path is manufactured from a plastic, a glass or a ceramic material. The plastic is preferably a silicon elastomer, such as is used as a passivation material in conventional piezoelectric actuators. The silicon elastomer is fluoridated for instance, thereby resulting in increased stability in respect of fuels. Other polymers are, likewise, conceivable, for instance, polyimide, polyurethane, epoxy resin or suchlike. Glass may however also include pure silicon oxide. A modification to the silicon oxide using a network converter, for instance, barium oxide (BaO), bismuth oxide (Bi2O3), natrium oxide (Na2O), kalium oxide (K2O), calcium oxide (CaO), etc. is, however, also conceivable. Additional additives in the glass for reducing the melting temperature or the sintering temperate are, likewise, conceivable. These materials are, for instance, aluminum oxide (Al2O3), zirconium oxide (ZrO2) or magnesium oxide (MgO). The piezoceramic, which is used in the piezoelectric layers, is advantageous as a ceramic material in the insulation path.

Known technologies, such as spray technology, screen molding, dispensers etc. are used to attach the insulation path and/or the additional insulation path. When using the polymeric material, attention should be paid to ensuring that the maximum tolerable application temperatures for plastics are not exceeded during the manufacture of the contacting paths. This relates, for instance, to the temperature at which an applied metal paste is transformed into the corresponding contacting path.

An ink or paste containing metal powder, at least partially in the form of nanoparticles, is preferably used to attach the contacting field, the additional contacting field, the contacting path and/or the additional contacting path. This means that an average particle diameter lies in the nanometer range. This range preferably extends from 2 nm to 100 nm. Due to their large powder surface, these metal powders are characterized by a high reactivity. A conversion temperature thus is relatively low. A thermal load on the overall component and above all on the insulation path is minimal.

In summary, the embodiments achieve the following particular advantages:
  with the aid of the structured external electrode it is possible to provide a fully active piezoelectric component, in which the electrode layers of the piezoelectric elements are contacted individually.
  The use of the insulation paths and the contacting paths allow the electrode layers to be contacted individually, with an efficient electrical insulation in respect of the adjacent electrode layers being ensured at the same time.
  The structuring of the paths used brings about flexible external contacting which may result from the expansion and contraction of the piezoelectric component. This results in a component with high reliability.

BRIEF DESCRIPTION OF THE DRAWINGS

These and other aspects and advantages will become more apparent and more readily appreciated from the following description of the exemplary embodiments, taken in conjunction with the accompanying drawings of which.

DETAILED DESCRIPTION OF THE PREFERRED EMBODIMENT

Figure 1:
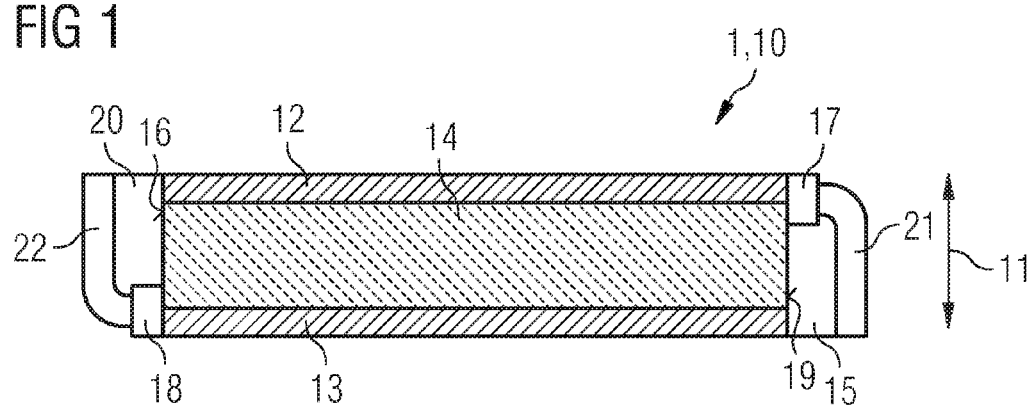
FIG. 1 shows a stacked piezoelectric element in a lateral cross-section.

Reference will now be made in detail to the preferred embodiments, examples of which are illustrated in the accompanying drawings, wherein like reference numerals refer to like elements throughout.

Different piezoelectric components 1 are described below (FIG. 1). The core of these piezoelectric components is a stacked piezoelectric element 10, which includes an electrode layer 12, an additional electrode layer 13 and a piezoelectric layer 14 arranged in the stack direction 11 between the two electrodes. The electrode material of the electrode layer and the additional electrode material of the additional electrode layer is a silver palladium alloy in each instance. The piezoelectric material of the piezoelectric layer is lead zirconate titanate, in other words a piezoceramic. The piezoelectric element is monolithic.

According to the exemplary embodiments, a piezoelectric component is available in a monolithic multilayer structure in each instance. A plurality of piezoelectric elements is arranged in the stack direction 101 (FIG. 2A) one above the other to form a piezoelectric element stack 100. The piezoelectric element stack is terminated in each case by a cover plate 110. These cover plates likewise are lead zirconate titanate. The cover plates are however piezoelectrically inactive, since no electrical field is coupled therein. The piezoelectric element stacks are monolithic. The monolithic piezoelectric element stacks are achieved by ceramic green films being pressworked with electrode material and with additional electrode material and being stacked one above the other. A multilayer, piezoceramic green element, which is subject to a debinding and subsequent sintering, thus, results. A monolithic piezoelectric element stack results from the sintering process.

Ceramic green films are pressworked such that, in the piezoelectric elements of the piezoelectric element stack, the electrode layer and/or the additional electrode layer delimit the entire surface of the adjacent piezoelectric layer in each instance.

Figure 2A:
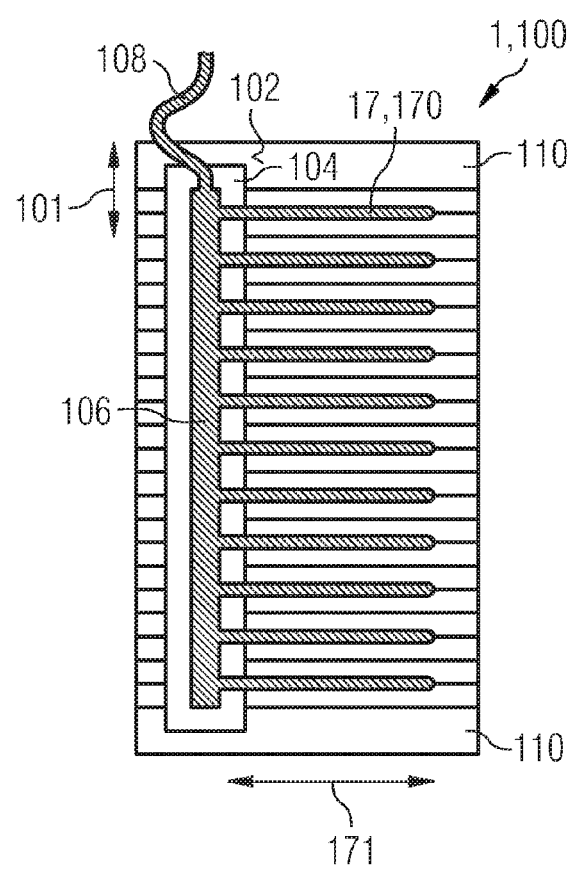
FIG. 2A shows a piezoelectric element stack from the side.
Figure 2B:
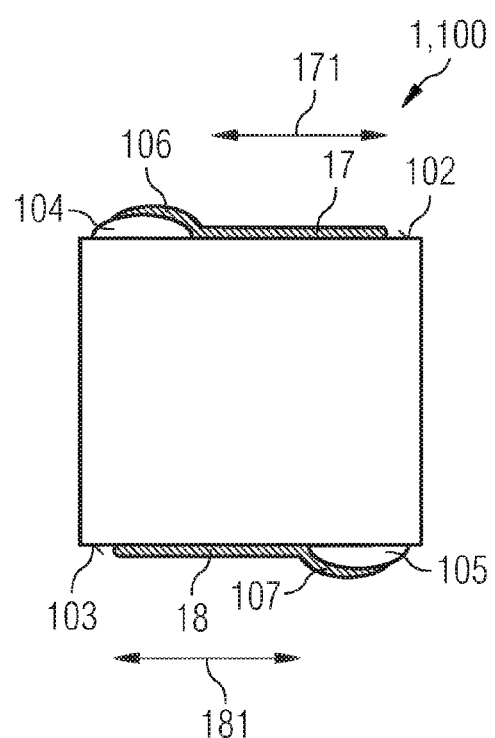
FIG. 2B shows a top view onto the piezoelectric element stack in FIG. 2A.

The electrode layer extends to a lateral surface segment 15 of the piezoelectric element. The additional electrode layer extends to an additional lateral surface segment 16 of the piezoelectric element. A contacting field 17 is directly attached to the electrode layer extending to the surface segment on the surface segment 15. The electrical contacting field 17 is configured as a contacting strip 170. The contacting strip has a longitudinal extension 171 (FIG. 2B). The longitudinal extension is arranged here in parallel with the electrode layer.

An electrical insulation path 19 is at least partially attached to the contacting field 17. According to a first exemplary embodiment, the insulation material of the electrical insulation path is a silicon elastomer. According to a second embodiment, the insulation material is glass. In a third embodiment, the insulation material is lead zirconate titanate. A contacting path 21 is attached to the insulation path such that the contacting path and the electrode layer are indirectly connected to one another in an electrically conductive fashion by way of the contacting field. By contrast, the contacting path and the additional electrode layer are electrically insulated from one another.

Figure 3A:
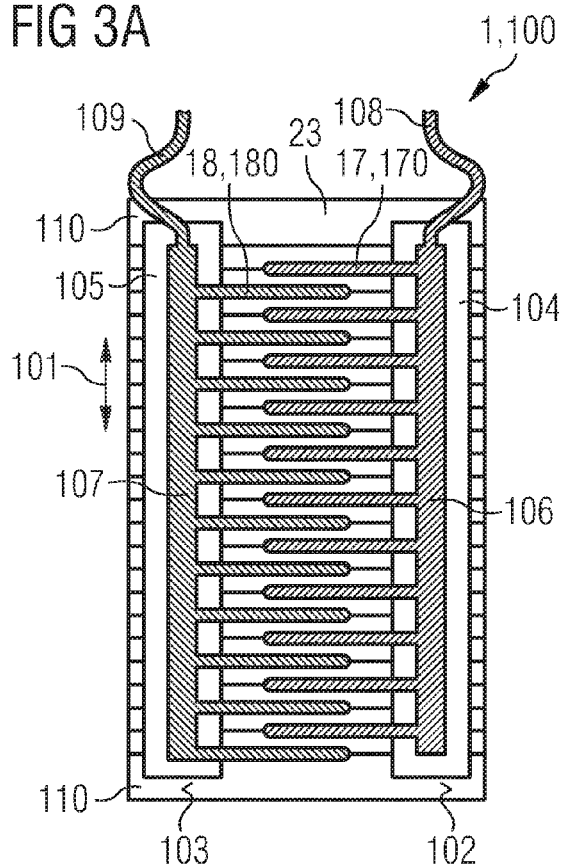
FIG. 3A shows an additional example of a piezoelectric element stack from the side.

The additional electrode layer is guided to an additional lateral surface segment 16 of the piezoelectric element. An additional electrical contacting field 18 is directly attached to the additional electrode layer on the additional surface segment. The additional electrical contacting field 18 is likewise extended longitudinally, in other words is configured as an additional contacting strip 180 (FIG. 3A). The additional contacting strip has an additional longitudinal extension 181 (FIG. 2B). The additional longitudinal extension is arranged here in parallel with an additional electrode layer.

An additional insulation path 20 is attached at least partially to the additional contacting field. The additional insulation material of the additional insulation path is the same as the insulation material of the insulation path. An additional contacting path 22 is attached to the additional insulation path. The additional contacting path 22 is attached here to the additional insulation path such that the additional contacting path and the additional electrode layer are indirectly connected to one another in an electrically conductive fashion by way of the additional contacting field. By contrast, the additional contacting path and the electrode layer are electrically insulated from one another.

The piezoelectric elements are arranged one above the other in the piezoelectric element stack such that the surface segments of the piezoelectric elements form a shared stack surface segment 102. The insulation paths of the piezoelectric elements lead to a shared stack insulation path 104. The contacting paths of the piezoelectric elements are likewise combined to form a shared stack contacting path 106. The same applies to the additional electrode layers. The additional surface segments of the piezoelectric elements form a shared additional stack surface segment 103, the additional insulation paths of the piezoelectric elements, an additional shared stack insulation path 105 (FIG. 3A) and the additional contacting paths of the piezoelectric elements form an additional stack contacting path 107. An electrical connector element 108 is soldered on in order to supply power to the stack contacting path. A corresponding additional electrical connecting element 109 is soldered onto the additional stack contacting path. Power is supplied to the electrode layers and the additional electrode layers by way of this connector element. As a result of the arrangement of the electrode layers and the additional electrode layers and their electrical contacting and/or insulation, these can apply different electrical potentials to the electrode layers and the additional electrode layers.

According to a first example, the surface segment with the contacting field and the additional surface segment with the additional contacting field are arranged on different sides of the piezoelectric element. The contacting of the electrode layers and the contacting of the additional electrode layers takes place on different sides of the piezoelectric element and thus the piezoelectric element stack (FIGS. 2A and 2B).

Figure 3B:
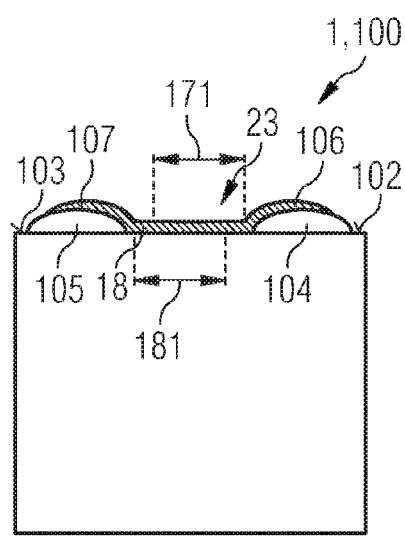
FIG. 3B shows the top view onto the piezoelectric element stack in FIG. 3A.

Alternatively to the example described, the surface segment with the contacting field and the additional surface segment with the additional contacting field are arranged on an identical side 23 (FIG. 3A) of the piezoelectric element. The electrical contacting of the electrode layer and the additional electrode layer takes place from the same side of the piezoelectric element and thus from the same side of the piezoelectric element stack (FIGS. 3A and 3B).

Figure 5A:
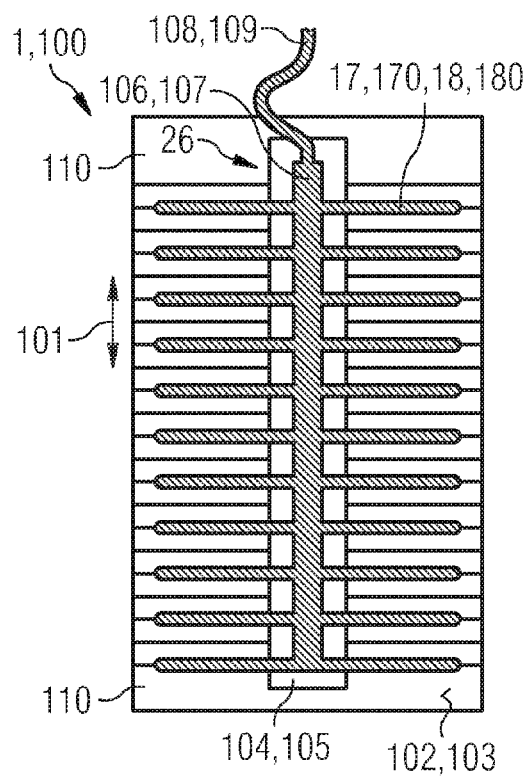
FIGS. 5A, 5B and 5C show stack variations.

The contacting and insulation paths can be configured differently and arranged differently on the piezoelectric element stack. An essentially linear course 26 is provided in accordance with FIGS. 5A and 5C. According to FIG. 5A, the paths are aligned directly in the stack direction of the piezoelectric element stack. In accordance with FIG. 5C, a diagonal curve is realized across the side face of the piezoelectric element stack. Notwithstanding the linear curve, FIG. 5B shows paths which have path curvatures 27.

Figure 4:
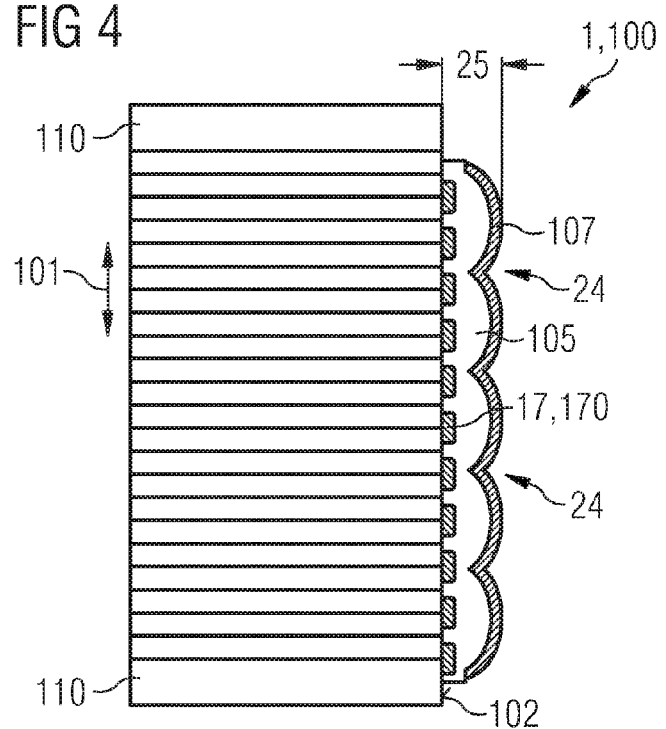
FIG. 4 shows a piezoelectric element stack in a lateral cross-section.
Figure 5B:
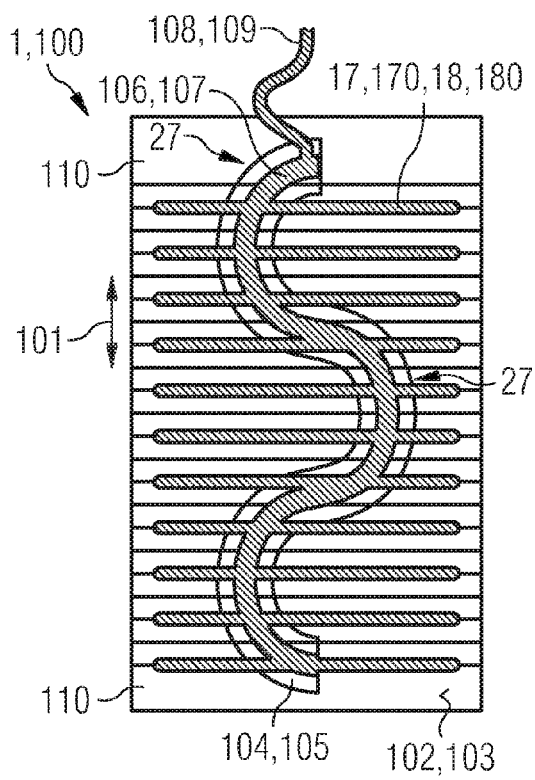
Figure 5C:
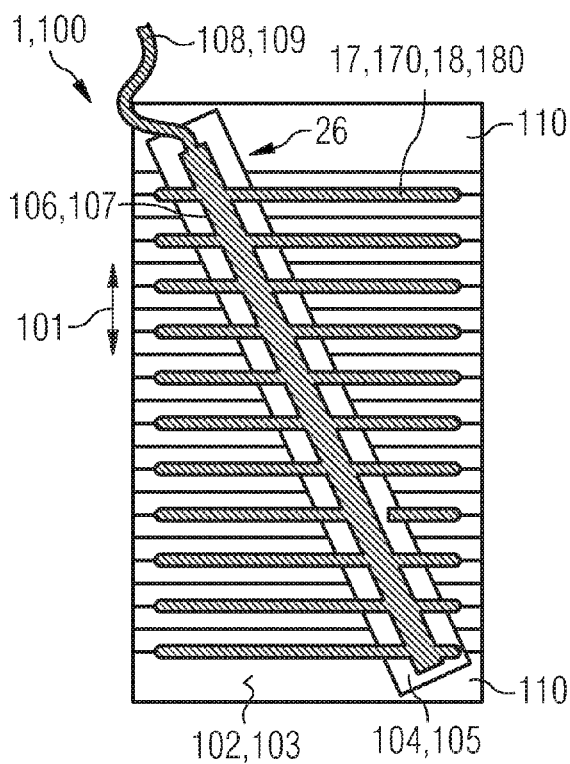

In addition to a structuring, as is shown in FIG. 5B, a structuring according to FIG. 4 is likewise provided. The paths have a transverse structuring 24. Furthermore, the additional insulation path 105 shown has a path thickness 25 which varies in the stack direction 101 of the overall stack.

The following procedure is adopted in order to manufacture the piezoelectric elements; a sintered piezoelectric element stack is provided with a corresponding number of piezoelectric elements. The electrode layers and the additional electrode layers of the piezoelectric elements completely delimit the entire surface of the piezoelectric layers in each instance.

The insulation path is subsequently attached. To this end, an unmeshed or only partially meshed prestage of the insulation material is attached in a structured fashion. Subsequent curing of the prestage results in a corresponding insulation path and/or in a corresponding additional insulation path.

The contacting fields are subsequently attached to the surface segments and/or to the electrode layers and the additional contacting fields are attached to the additional surface segments and/or to the additional electrode layers. The contacting fields at least partially cover the insulation path. Corresponding metallizations are generated. To this end, contacting ink is applied using an ink jet method. Alternatively, the contacting ink is applied by means of microspraying. The contacting ink contains a metal powder in the form of nanoparticles.

The applied contacting ink is then burnt in. The contacting path and/or the additional contacting path is in turn attached to the insulation path and/or to the additional insulation path with the aid of the above-described method. The contacting path and the additional contacting path are electrically contacted by soldering the corresponding electrical connector elements.

The component can be used to activate an injection valve in an internal combustion engine.

The system also includes permanent or removable storage, such as magnetic and optical discs, RAM, ROM, etc. on which the process and data structures of the embodiments can be stored and distributed. The processes can also be distributed via, for example, downloading over a network such as the Internet. The system can output the results to a display device, printer, readily accessible memory or another computer on a network.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

What is claims is:

1. A piezoelectric component, comprising:
   at least one stacked piezoelectric element which, in the stack direction, has at least one electrode layer of electrode material, at least one additional electrode layer of additional electrode material and at least one piezoelectric layer of piezoelectric material and arranged between the electrode layers;
   the electrode layer extending to lateral surface segments on each side of the stacked piezoelectric element;
   at least one contacting field of contacting field material being attached to the surface segment for electrical contacting of the electrode layer along an entirety of a length of the contacting field and being exposed on an outside of the component,
   at least one electrical insulation path of electrical insulation material being attached to the surface segment on the contacting field and/or on the electrode layer with the contacting field being uncovered by the insulation material; and
   at least one electrical contacting path of contacting path material being arranged on the insulation path with the contacting path and the electrode layer indirectly connected to one another in an electrically conductive fashion by way of the contacting field, and the contacting path and the additional electrode layer are electrically insulated from one another.

2. The piezoelectric component as claimed in claim 1, further comprising:
   the additional electrode layer extending to at least one additional lateral surface segment of the piezoelectric element;
   at least one additional contacting field of contacting field material being attached to the additional surface segment for electrical contacting of the additional electrode layer;
   an additional electrical insulation path of additional electrical insulation material being attached to the additional contacting field and/or to the additional electrode layer on the additional surface segment; and
   at least one additional contacting path of additional contacting path material being arranged on the additional insulation path with the additional contacting path and the additional electrode layer indirectly connected to one another in an electrically conductive fashion by way of the additional contacting field, and the additional contacting path and the electrode layer are electrically insulated from one another.

3. The piezoelectric component as claimed in claim 1, wherein the surface segment with the contacting field and the additional surface segment with the additional contacting field being arranged on an identical side of the piezoelectric element.

4. The piezoelectric component as claimed in claim 1, wherein the surface segment with the contacting field and the additional surface segment with the additional contacting field being arranged on different sides of the piezoelectric element.

5. The piezoelectric component as claimed in claim 1, wherein the electrode layer and/or the additional electrode layer delimiting the entire surface of the piezoelectric layer.

6. The piezoelectric component as claimed in claim 1, wherein the contacting field comprising a contacting strip with a longitudinal extension, which is aligned in parallel to the electrode layer and/or the additional contacting field comprising an additional contacting strip with an additional longitudinal extension, which is aligned in parallel to the additional electrode layer.

7. The piezoelectric component as claimed in claim 2, wherein the insulation path, the additional insulation path, the contacting field, the additional contacting field, the contacting path and/or the additional contacting path being configured so as to be extendable.

8. The piezoelectric component as claimed in claim 2, wherein the insulation path, the additional insulation path, the contacting field, the additional contacting field, the contacting path and/or the additional contacting path comprising at least one longitudinal structuring and/or transverse structuring in respect of the stack direction.

9. The piezoelectric component as claimed in claim 2, wherein the insulation path, the additional insulation path, the contacting path and/or the additional contacting path have a varying path thickness in the stack direction.

10. The piezoelectric component as claimed in claim 2, wherein the insulation path, the additional insulation path, the contacting path and/or the additional contacting path comprising an essentially linear curve in the stack direction.

11. The piezoelectric component as claimed in claim 2, wherein the insulation path, the additional insulation path, the contacting path and/or the additional contacting path comprising at least one path curvature along the stack direction.

12. The piezoelectric component as claimed in claim 2, wherein the electrode material, the additional electrode material, the contacting field material, the additional contacting field material, the contacting path material and/or the additional contacting path material comprising at least one metal selected from the group comprising gold, copper, nickel, palladium, platinum and silver.

13. The piezoelectric component as claimed in claim 2, wherein the insulation material and/or the additional insulation material comprising at least one insulation material selected from the group comprising plastic, glass and/or ceramics.

14. The piezoelectric component as claimed in claim 1, wherein a plurality of piezoelectric elements being arranged one above the other in respect of a piezoelectric element stack, such that
- the surface segments of the piezoelectric elements form a shared stack surface segment,
- the insulation paths of the piezoelectric elements form a shared stack insulation path, and
- the contacting paths of the piezoelectric elements form a shared stack contacting path, which is attached to the shared stack insulation path such that the shared stack contacting path and the electrode layers of the piezoelectric elements are indirectly electrically contacted by way of the contacting field of the piezoelectric elements and the shared stack contacting path and the additional electrode layers of the piezoelectric elements are electrically insulated from one another.

15. The piezoelectric component as claimed in claim 14, wherein the plurality of piezoelectric elements being arranged in respect of the piezoelectric element stack such that
- the additional surface segments of the piezoelectric elements form a shared additional stack surface segment,
- the additional insulation paths of the piezoelectric elements form an additional shared stack insulation path, and
- the additional contacting paths of the piezoelectric elements form an additional shared stack contacting path, which is attached to the shared additional stack insulation path such that the additional shared stack contacting path and the additional electrode layers of the piezoelectric elements are indirectly electrically contacted by way of the additional contacting fields of the piezoelectric elements and the shared additional stack contacting path and the electrode layers of the piezoelectric elements are electrically insulated from one another.

16. The piezoelectric component as claimed in claim 1 used for activating an injection valve in an internal combustion engine.

* * * * *